United States Patent
Cheung

(10) Patent No.: US 8,258,456 B2
(45) Date of Patent: Sep. 4, 2012

(54) IMAGE SENSOR

(75) Inventor: Desmond Cheung, Grand Cayman (KY)

(73) Assignee: Himax Imaging, Inc., Grand Cayman (KY)

( * ) Notice: Subject to any disclaimer, the term of this patent is extended or adjusted under 35 U.S.C. 154(b) by 516 days.

(21) Appl. No.: 12/626,684

(22) Filed: Nov. 27, 2009

(65) Prior Publication Data

US 2011/0127412 A1 Jun. 2, 2011

(51) Int. Cl.
*H01L 31/0232* (2006.01)
(52) U.S. Cl. .......... 250/226; 359/586; 438/636
(58) Field of Classification Search ........ 250/226; 359/580, 586, 589; 438/634, 636, 724
See application file for complete search history.

(56) References Cited

U.S. PATENT DOCUMENTS

| | | | |
|---|---|---|---|
| 2002/0022358 A1* | 2/2002 | Yin et al. | 438/636 |
| 2002/0022359 A1* | 2/2002 | Yin et al. | 438/636 |
| 2004/0137718 A1* | 7/2004 | Yin et al. | 438/636 |
| 2006/0268415 A1* | 11/2006 | Huang | 359/582 |

* cited by examiner

*Primary Examiner* — Seung C Sohn
(74) *Attorney, Agent, or Firm* — Winston Hsu; Scott Margo

(57) ABSTRACT

The present invention provides an image sensor. The image sensor comprises: a substrate, a plurality of optical elements, a first insulation layer, an anti-reflective coating (ARC) layer, a second insulation layer, and a color filter array. The optical elements are disposed in the substrate. The first insulation layer is disposed on the substrate and the optical elements. The ARC layer is disposed on the first insulation layer. The second insulation layer is disposed on the ARC layer. The color filter array is disposed on the second insulation layer, and the color filter array comprises a plurality of color filters corresponding to a plurality of different colors of light, respectively. The ARC layer comprises a plurality of sections directly below the color filters in a vertical direction, respectively, and the sections have different inherent reflection characteristics. The image sensor of the present invention can increase sensitivity and reduce crosstalk.

6 Claims, 2 Drawing Sheets

IMAGE SENSOR

BACKGROUND OF THE INVENTION

1. Field of the Invention

The present invention relates to an image sensor, and more particularly, to an image sensor which is capable of increasing sensitivity and reducing crosstalk.

2. Description of the Prior Art

Please refer to FIG. 1. FIG. 1 shows a sectional diagram of a conventional image sensor 100. As shown in FIG. 1, The image sensor 100 comprises: a substrate 110, three photodiodes 112, 114, 116, a first insulation layer 120, an anti-reflective coating (ARC) layer 130, a second insulation layer 140, and a color filter array 150. The photodiodes 112, 114, 116 are disposed in the substrate 110. The first insulation layer 120 is disposed on the substrate 110 and the photodiodes 112, 114, 116. The ARC layer 130 is disposed on the first insulation layer 110. The second insulation layer 140 is disposed on the ARC layer 130. The color filter array 150 is disposed on the second insulation layer 140, and the color filter array 150 comprises color filters, such as a red monochromatic color filter 152, a green monochromatic color filter 154, and a blue monochromatic color filter 156. Reflection is more severe when light goes from the second insulation layer 140 to the first insulation layer 120 when the change in refractive index of the first insulation layer 120 and the second insulation layer 140 is large. Thus, the ARC layer 130 is utilized to reduce reflection. However, the ARC layer 130 with a uniform thickness is not optimized for different colors of light.

SUMMARY OF THE INVENTION

It is therefore one of the objectives of the present invention to provide an image sensor which is capable of increasing sensitivity and reducing crosstalk, so as to solve the above problem.

According to an embodiment of the present invention, an image sensor is disclosed. The image sensor comprises: a substrate, a plurality of optical elements, a first insulation layer, an anti-reflective coating (ARC) layer, a second insulation layer, and a color filter array. The optical elements are disposed in the substrate. The first insulation layer is disposed on the substrate and the optical elements. The ARC layer is disposed on the first insulation layer. The second insulation layer is disposed on the ARC layer. The color filter array is disposed on the second insulation layer, and the color filter array comprises a plurality of color filters corresponding to a plurality of different colors of light, respectively. The ARC layer comprises a plurality of sections directly below the color filters in a vertical direction, respectively, and the sections have different inherent reflection characteristics.

Briefly summarized, the image sensor of the present invention can increase sensitivity and reduce crosstalk.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular components. As one skilled in the art will appreciate, hardware manufacturers may refer to a component by different names. This document does not intend to distinguish between components that differ in name but in function. In the following discussion and in the claims, the terms "include", "including", "comprise", and "comprising" are used in an open-ended fashion, and thus should be interpreted to mean "including, but not limited to . . .".

Figure 1:
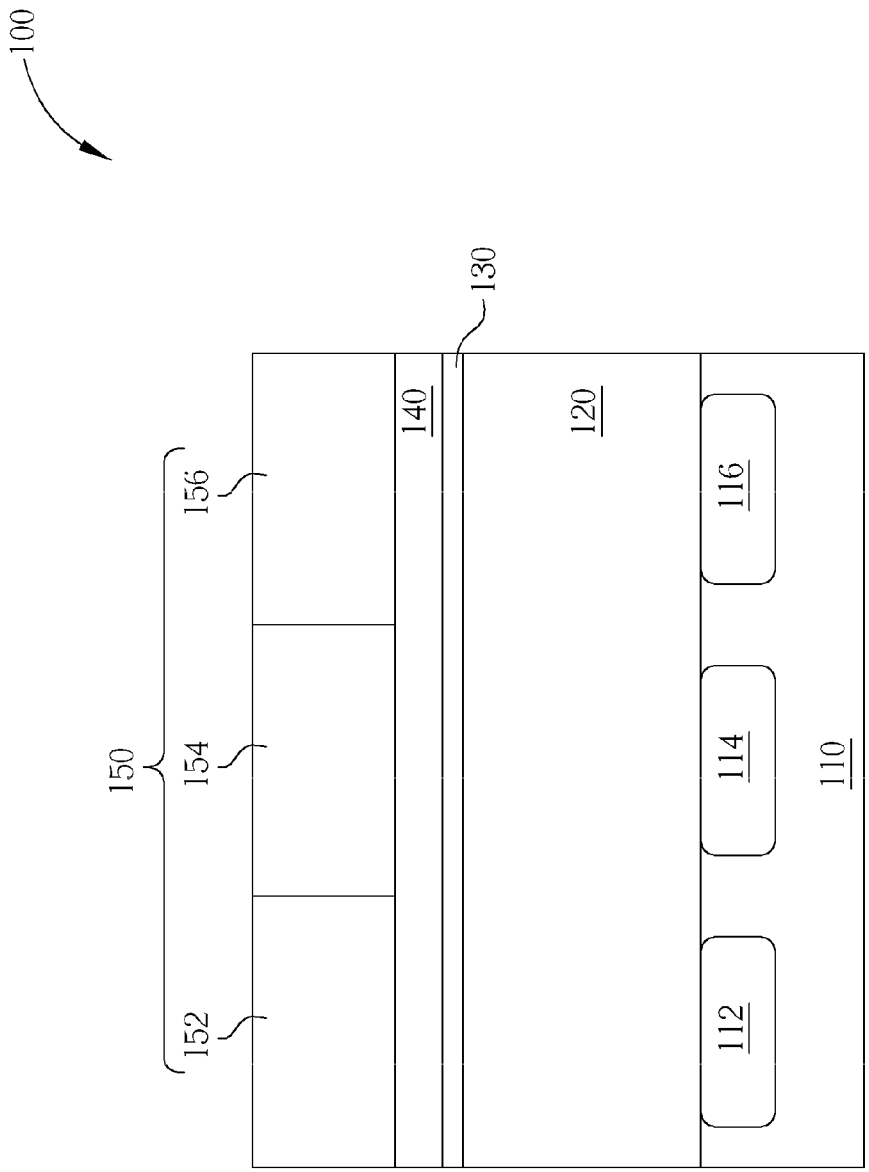
FIG. 1 shows a sectional diagram of a conventional image sensor.
Figure 2:
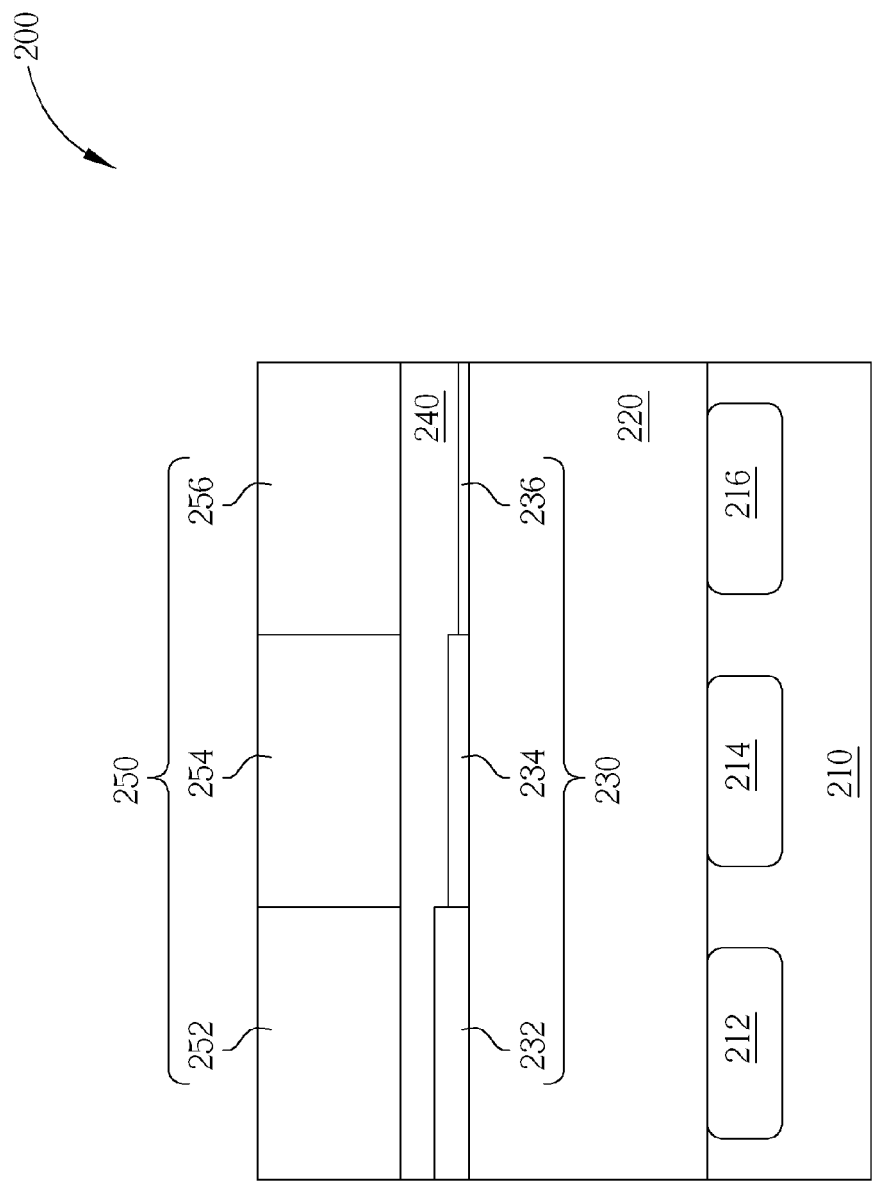
FIG. 2 shows a sectional diagram of an image sensor according to an embodiment of the present invention.

Please refer to FIG. 2. FIG. 2 shows a sectional diagram of an image sensor 200 according to an embodiment of the present invention. As shown in FIG. 2, The image sensor 200 comprises: a substrate 210, three optical elements 212, 214, 216, a first insulation layer 220, an anti-reflective coating (ARC) layer 230, a second insulation layer 240, and a color filter array 250. The image sensor 200 can be a CMOS image sensor, and the optical elements can be photodiodes. The optical elements 212, 214, 216 are disposed in the substrate 210. The first insulation layer 220 is disposed on the substrate 210 and the optical elements 212, 214, 216. The ARC layer 230 is disposed on the first insulation layer 220. The second insulation layer 240 is disposed on the ARC layer 230. The color filter array 250 is disposed on the second insulation layer 240, and the color filter array 250 comprises color filters, such as a red monochromatic color filter 252, a green monochromatic color filter 254, and a blue monochromatic color filter 256. The ARC layer 230 comprises three sections 232, 234, 236 directly below the red monochromatic color filter 252, the green monochromatic color filter 254, and the blue monochromatic color filter 256 in a vertical direction, respectively, wherein the sections 232, 234, 236 have different thicknesses in the vertical direction, and thus the sections 232, 234, 236 have different inherent reflection characteristics. In other words, the ARC layer 230 is individually tuned for different colors, and this results in better color discrimination for each intended color for better detection by the optical elements 212, 214, 216. More specifically, the ARC layer 230 can reduce reflection of the desired wavelength, and this implies more light of that desired color can reach the corresponding optical element for photon collection. In other words, the ARC layer 230 can increase sensitivity. In addition, the ARC layer 230 can make more of undesired wavelengths reflected, and this implies less undesired color can reach the corresponding optical element for photon collection. In other words, the ARC layer 230 can reduce crosstalk.

Please note that the embodiment mentioned above is only for illustrative purposes, but is not a limitation of the present invention. For example, thicknesses of the sections 232, 234, 236 can be varied according to different conditions or requirements.

Briefly summarized, the image sensor 200 of the present invention can increase sensitivity and reduce crosstalk.

Those skilled in the art will readily observe that numerous modifications and alterations of the device and method may be made while retaining the teachings of the invention.

What is claimed is:

1. An image sensor, comprising:
   a substrate;
   a plurality of optical elements, disposed in the substrate;
   a first insulation layer, disposed on the substrate and the optical elements;

an anti-reflective coating (ARC) layer, disposed on the first insulation layer;

a second insulation layer, disposed on the ARC layer; and a color filter array, disposed on the second insulation layer, comprising a plurality of color filters corresponding to a plurality of different colors of light, respectively;

wherein the ARC layer comprises a plurality of sections directly below the color filters in a vertical direction, respectively, and the sections have different inherent reflection characteristics.

2. The image sensor of claim 1, wherein the sections have different thicknesses in the vertical direction.

3. The image sensor of claim 1, wherein the image sensor is a complementary metal-oxide semiconductor (CMOS) image sensor.

4. The image sensor of claim 3, wherein the optical elements comprise a plurality of photodiodes.

5. The image sensor of claim 4, wherein the color filters comprises three monochromatic color filters corresponding to the photodiodes, respectively.

6. The image sensor of claim 5, wherein the monochromatic color filters comprise a red monochromatic color filter, a green monochromatic color filter, and a blue monochromatic color filter.

* * * * *